(12) United States Patent
Chen et al.

(10) Patent No.: US 10,109,689 B2
(45) Date of Patent: *Oct. 23, 2018

(54) PACKAGE METHOD OF SUBSTRATE AND PACKAGE STURCTURE

(71) Applicant: Shenzhen China Star Optoelectronics Technology Co., Ltd., Shenzhen, Guangdong (CN)

(72) Inventors: Lindou Chen, Guangdong (CN); Kai Shi, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 0 days.

This patent is subject to a terminal disclaimer.

(21) Appl. No.: 15/607,570

(22) Filed: May 29, 2017

(65) Prior Publication Data

US 2018/0061912 A1    Mar. 1, 2018

Related U.S. Application Data

(62) Division of application No. 15/245,423, filed on Aug. 24, 2016, now Pat. No. 9,722,004.

(51) Int. Cl.
| | |
|---|---|
| *H01L 29/22* | (2006.01) |
| *H01L 27/32* | (2006.01) |
| *H01L 21/02* | (2006.01) |
| *H01L 21/56* | (2006.01) |
| *H01L 51/56* | (2006.01) |
| *H01L 23/31* | (2006.01) |
| *H01L 51/52* | (2006.01) |

(52) U.S. Cl.
CPC .... *H01L 27/3244* (2013.01); *H01L 21/02348* (2013.01); *H01L 21/563* (2013.01); *H01L 23/3157* (2013.01); *H01L 27/3204* (2013.01); *H01L 27/3248* (2013.01); *H01L 51/5246* (2013.01); *H01L 51/56* (2013.01); *H01L 51/5259* (2013.01); *H01L 2227/323* (2013.01)

(58) Field of Classification Search
CPC ............ H01L 23/3157; H01L 27/3244; H01L 21/02348; H01L 51/5246
USPC .................................................. 257/98–100
See application file for complete search history.

(56) References Cited

U.S. PATENT DOCUMENTS

| | | | | |
|---|---|---|---|---|
| 6,641,933 B1* | 11/2003 | Yamazaki | ........... | H01L 51/0025 313/504 |
| 7,030,423 B2* | 4/2006 | Chang | ................... | H01L 33/486 257/100 |
| 7,579,629 B2* | 8/2009 | Inoguchi | ............. | H01L 25/0753 257/98 |
| 2013/0168723 A1* | 7/2013 | Kasae | ..................... | F21V 21/00 257/99 |

* cited by examiner

*Primary Examiner* — Nitin Parekh
(74) *Attorney, Agent, or Firm* — Andrew C. Cheng

(57) ABSTRACT

A package structure includes a substrate and a package plate. A frame is formed of a seal glue arranged between the substrate and the package plate. An underfill is positioned inboard of the frame. The package plate has a spreading surface, and at least one groove is formed in a spreading path of the frame on the spreading surface of the package plate.

12 Claims, 4 Drawing Sheets

PACKAGE METHOD OF SUBSTRATE AND PACKAGE STURCTURE

CROSS REFERENCE TO RELATED APPLICATIONS

This is a continuation of U.S. patent application Ser. No. 15/245,423, filed on Aug. 24, 2016, which is a divisional application of U.S. patent application Ser. No. 14/381,986, filed on Aug. 28, 2014, which is a national stage of PCT Application Number PCT/CN2014/082129, filed on Jul. 14, 2014, claiming foreign priority of Chinese Patent Application Number 201410284825.0, filed on Jun. 23, 2014.

FIELD OF THE INVENTION

The present invention relates to a display skill field, and more particularly to a package method of substrate design and a manufacture method thereof.

BACKGROUND OF THE INVENTION

In the display skill field, Liquid Crystal Display (LCD), Organic Light Emitting Diode (OLED) and other panel display skills have been gradually replaced the CRT displays. The OLED possesses many outstanding properties of self-illumination, low driving voltage, high luminescence efficiency, fast response, high clarity and contrast, near 180° view angle, wide range of working temperature, applicability of flexible display and large scale full color display. The OLED is considered as most potential flat panel display technology.

At present, the most significant issue restricting the development of OLED industry and the biggest defect of the OLED is the short life time of the OLED. The root cause of the shot lifetime for the OLED is the electrode and organic material are extremely sensitive to the moisture and the oxygen. Therefore, an efficient package of preventing the moisture and the oxygen into the interior of the OLED is very important for extending the lifetime of the OLED and guaranteeing the performance of the OLED.

The key of the efficient package for the OLED is to control the package quality during the factory manufacture of the OLED for ensuring the availability of the OLED elements. The package of the OLED can be categorized and mainly comprises several types of: drier package, UV glue package (Dam only), UV glue and underfill package (Dam & Fill package), glass glue package (Frit package) and etc. Among these, the Dam & Fill package possesses advantages of simple art, applicability of large size package, flexible package procedure, stability and reliability and etc. More and more applications have been derived therefrom and the manufacture cost can be effectively reduced.

As shown in FIG. 1 and FIG. 2, an existing package method of a TFT substrate having OLED elements is: coating seal glue continuously on a package plate 100 to form an inner glue frame 200 and an outer glue frame 300; underfill 400 is dispensed drop by drop and intermittently; then, package plate 100 and the TFT substrate having OLED elements are laminated in a VAS machine. Because the viscosity of the underfill 400 is lower, the underfill 400 is spread to fill in the area surround by the inner glue frame 200 under pressure during the lamination process; finally, an UV light is utilized to irradiate the seal glue and the underfill and solidify both. Accordingly, the package plate 100 of packaging the TFT substrate having OLED elements is realized.

However, in actual manufacture processes, gaps among the droplets of the underfill 400 may become bubbles after the lamination of the package plate 100 and the TFT substrate having OLED elements. However, the bubbles are hard to be eliminated due to the restrictions of the inner, outer glue frame 200, 300. The situation of remaining bubbles because underfill 400 cannot fill in the area surrounded by the inner glue frame 200 may often occur and affect the performance and the lifetime of the OLED elements.

SUMMARY OF THE INVENTION

An objective of the present invention is to provide a package method of a substrate capable of solving issue of existing bubbles in underfill which is under filled as implementing Dam & Fill package, and accordingly to improve the package result, to raise the performance of the OLED elements, and to extend the lifetime of the OLED elements.

Another objective of the present invention is to provide a package structure of a substrate capable of making no bubble among adhesives of the underfill and filling in the frame for guaranteeing a good package result, and accordingly to raise the performance of the OLED elements, and to extend the lifetime of the OLED elements.

For realizing the aforesaid objective, the present invention provides a package method of a substrate, comprising steps of:

step 1, providing the substrate and a package plate, and the package plate comprises a spreading surface;

step 2, forming at least one groove in a spreading path of a frame on the spreading surface of the package plate;

step 3, spreading seal glue on the spreading surface of the package plate to form the continuous frame, and a recess is formed in the frame corresponding to the at least one groove;

step 4, positioning underfill inside an area surrounded by the frame on the spreading surface of the package plate;

step 5, oppositely fitting the substrate and the package plate, and an air outlet is formed at a position of the recess of the frame between the substrate and the package plate;

step 6, extracting air between the substrate and the package plate through the air outlet;

step 7, laminating the substrate and the package plate;

step 8, irradiating and solidifying the seal glue and the underfill with UV light to accomplish packaging the substrate with the package plate.

The substrate is a TFT substrate having OLED elements.

The frame to be formed in the step 2 comprises an inner glue frame and an outer glue frame, and at least one groove is formed respectively in spreading paths of the inner and outer glue frames on the spreading surface of the package plate.

The grooves in the spreading path for forming the inner glue frame and the grooves in the spreading path for forming the outer glue frame are aligned.

An amount of the grooves in the spreading path for forming the inner glue frame and an amount of the grooves in the spreading path for forming the outer glue frame are respectively four.

In the step 3, a thickness of the frame at a position of the groove of the package plate and a thickness at other positions of the package plate are the same.

In the step 3, a vertical distance d from a top point of the frame at the lowest position of the groove to the spreading surface of the package plate is larger than a thickness of the frame after being laminated in the step 7.

In the step 4, the underfill is dispensed, and the underfill keeps a safe gap from an inner edge of the frame in the groove to prevent that the underfill spills out of the groove during the lamination in the step 7.

The seal glue is UV glue, and the underfill is a liquid transparent drier, and a width of the frame in the groove is larger than 2 mm after the lamination in the step 7.

The present invention further provides a package structure, comprising: a substrate, a package plate, a frame formed by seal glue between the substrate and the package plate and underfill, and the underfill is positioned at an inner side of the frame, and the package plate comprises a spreading surface, and at least one groove is formed in a spreading path of a frame on the spreading surface of the package plate.

The substrate is a TFT substrate having OLED elements; the frame comprises an inner glue frame and an outer glue frame, and at least one groove is formed respectively in spreading paths corresponding to the inner and outer glue frames on the spreading surface of the package plate, and the grooves in the spreading path of the inner glue frame and the grooves in the spreading path of the outer glue frame are aligned.

The seal glue is UV glue, and the underfill is a liquid transparent drier, and a width of the frame in the groove is larger than 2 mm.

The present invention further provides a package structure, comprising: a substrate, a package plate, a frame formed by seal glue between the substrate and the package plate and underfill, and the underfill is positioned at an inner side of the frame, and the package plate comprises a spreading surface, and at least one groove is formed in a spreading path of a frame on the spreading surface of the package plate;

the substrate is a TFT substrate having OLED elements; the frame comprises an inner glue frame and an outer glue frame, and at least one groove is formed respectively in spreading paths corresponding to the inner and outer glue frames on the spreading surface of the package plate, and the grooves in the spreading path of the inner glue frame and the grooves in the spreading path of the outer glue frame are aligned;

the seal glue is UV glue, and the underfill is a liquid transparent drier, and a width of the frame in the groove is larger than 2 mm.

The benefits of the present invention are: according to the package method of the substrate, by forming the grooves on the spreading surface of the package plate and forming recesses corresponding to the grooves as the frame is formed, the air outlet is formed after fitting the substrate and the package plate. Therefore, the air between the substrate and the package plate can be extracted. The issue of existing bubbles in underfill which is under filled as implementing Dam & Fill package can be solved. Accordingly, the present invention can improve the package result, raise the performance of the OLED elements, and extend the lifetime of the OLED elements. The method is simple and practicable. With the package structure of the present invention, by forming the grooves in the spreading path corresponding to the frame on the spreading surface of the package plate, it is capable of making no bubble among adhesives of the underfill and filling in the frame for guaranteeing a good package result. Accordingly, the performance of the OLED elements can be raised, and the lifetime of the OLED elements can be extended.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Figure 1:
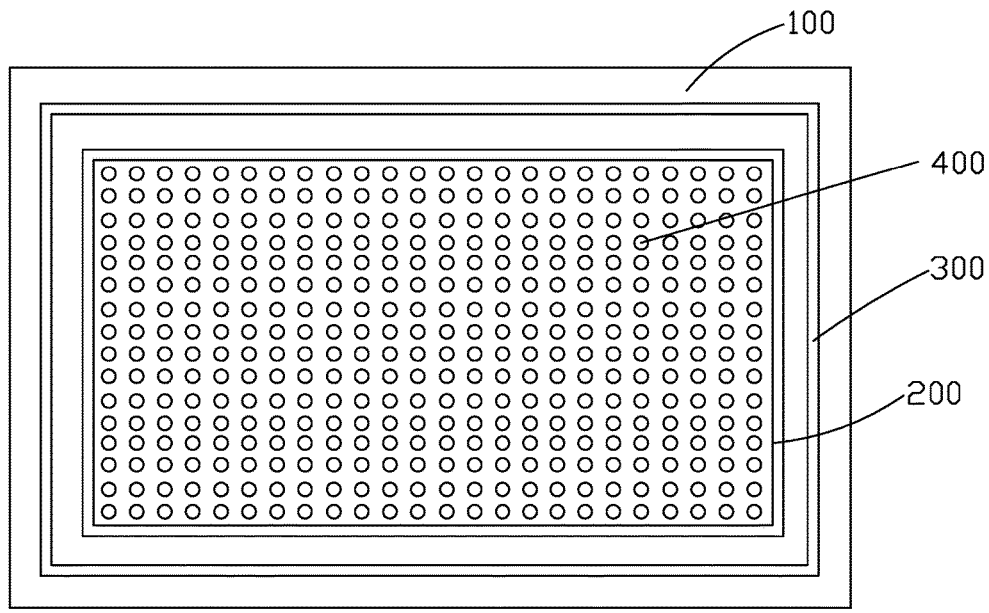
FIG. 1 is a diagram of a package plate before lamination of a package plate and a substrate according to a package method of a substrate of prior art.
Figure 2:
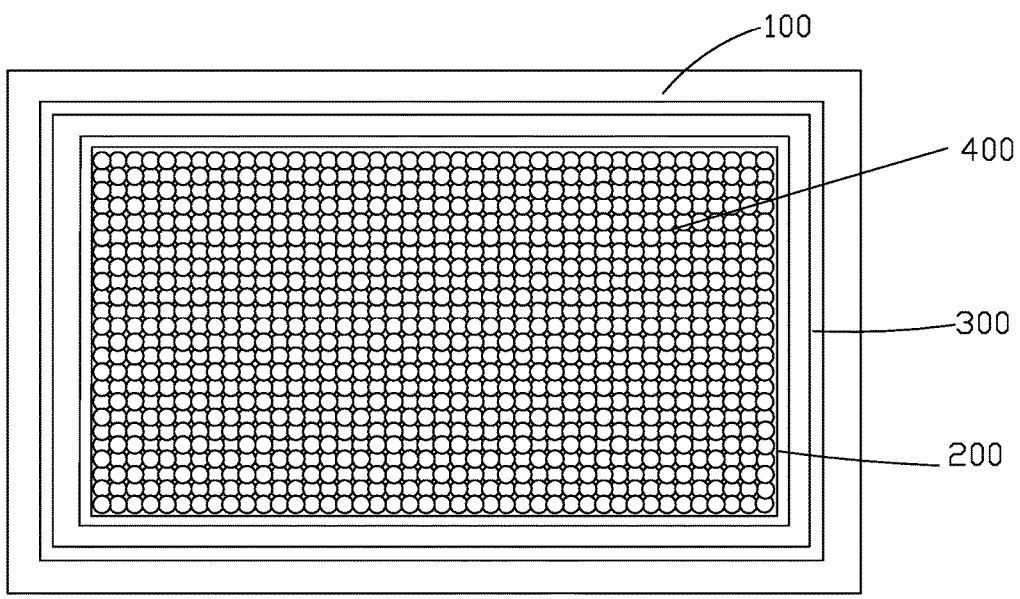
FIG. 2 is a diagram of a package plate after lamination of the package plate and the substrate according to the package method of the substrate of prior art.
Figure 3:
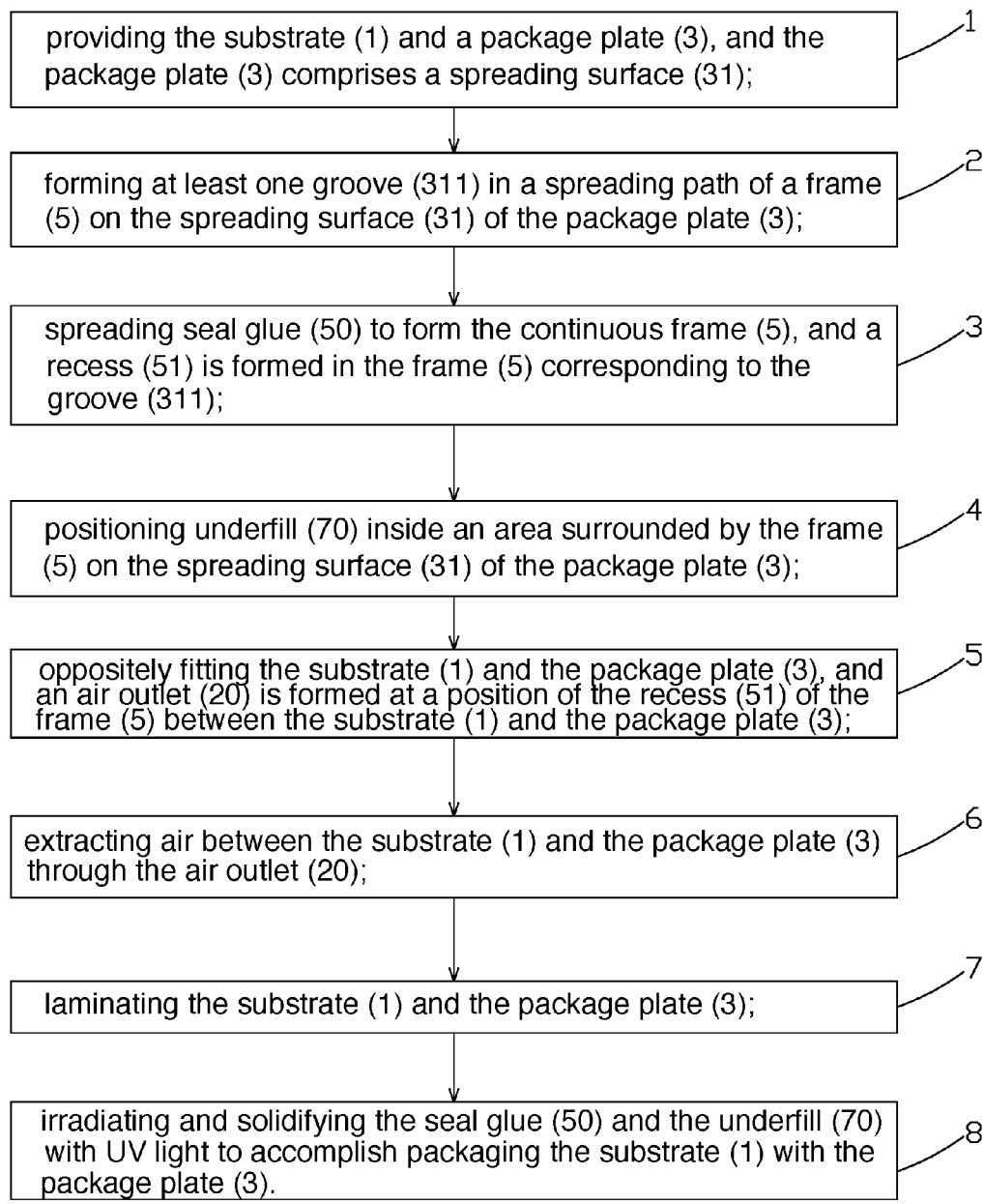
FIG. 3 is a flowchart of a package method of a substrate according to the present invention.
Figure 4:
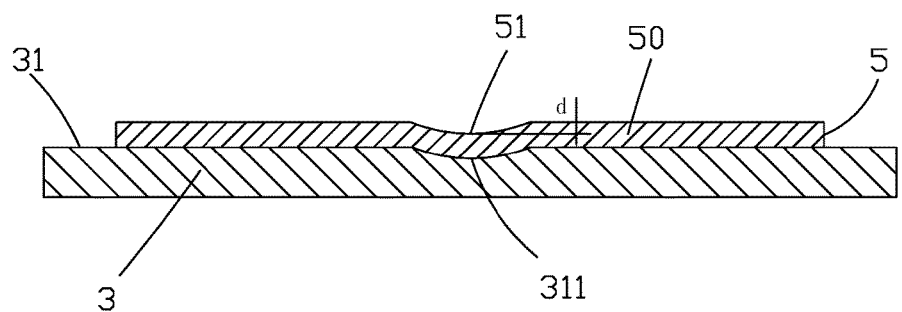
FIG. 4 is a main sectional diagram of step 3 of the package method of a substrate according to the present invention.

Embodiments of the present invention are described in detail with the technical matters, structural features, achieved objects, and effects with reference to the accompanying drawings as follows.

Please refer to FIG. 3 to FIG. 7. The present invention provides a package method of a substrate, comprising steps of:

step 1, providing the substrate 1 and a package plate 3, and the package plate 3 comprises a spreading surface 31;

step 2, forming at least one groove 311 in a spreading path of a frame 5 on the spreading surface 31 of the package plate 3;

step 3, spreading seal glue 50 on the spreading surface 31 of the package plate 3 to form the continuous frame 5, and a recess 51 is formed in the frame 5 corresponding to the at least one groove 311;

step 4, positioning underfill 70 inside an area surrounded by the frame 5 on the spreading surface 31 of the package plate 3;

step 5, oppositely fitting the substrate 1 and the package plate 3, and an air outlet 20 is formed at a position of the recess 51 of the frame 5 between the substrate 1 and the package plate 3;

step 6, extracting air between the substrate 1 and the package plate 3 through the air outlet 20;

step 7, laminating the substrate 1 and the package plate 3;

step 8, irradiating and solidifying the seal glue 50 and the underfill 70 with UV light to accomplish packaging the substrate 1 with the package plate 3.

Specifically, the substrate provided in the step 1 is a TFT substrate having OLED elements.

The frame 5 to be formed in the step 2 comprises an inner glue frame 53 and an outer glue frame 55, and at least one groove 311 is formed respectively in spreading paths of the inner and outer glue frames 53, 55 on the spreading surface 31 of the package plate 3. The grooves 311 in the spreading path for forming the inner glue frame 53 and the grooves 311 in the spreading path for forming the outer glue frame 55 are aligned. Preferably, the inner and outer glue frames 53, 55 to be formed are rectangular. An amount of the grooves in the spreading path for forming the inner glue frame and an amount of the grooves in the spreading path for forming the outer glue frame are respectively four and distributed at center positions of the four sides of the rectangles. For preventing that the underfill 70 spills out of the groove 311 under a higher pressure of atmosphere during the lamination of the substrate 1 and package plate 3 in the step 7 and for guaranteeing that a width of the frame 5 in the groove 311 after lamination is larger than 2 mm, the radian of the groove 311 should not be too large.

In the step 3, the continuous frame 5 is formed by spreading the seal glue 50 on the spreading surface 31 of the package plate 3, and the recess 51 is formed in the frame 5 corresponding to the at least one groove 311. The seal glue 50 is UV glue. The distance between the nozzle of spreading the seal glue 50 and the spreading surface 31 of the package plate 3 is fixed, and then the frame which the appearance is the same as the spreading path can be formed. Therefore, a thickness of the frame 5 at a position of the groove 311 of the package plate 3 and a thickness at other positions of the package plate 3 are the same. For ensuring the recess 51 of the frame 5 will vanish after the lamination of the substrate 1 and package plate 3 in the step 7 and realizing the complete sealing of the substrate 1 and package plate 3, a vertical distance d from a top point of the frame 5 at the lowest position of the groove 311 to the spreading surface 31 of the package plate 3 is larger than a thickness of the frame 5 after being laminated in the step 7.

In the step 4, the underfill is dispensed, and the underfill keeps a safe gap from an inner edge of the frame in the groove to prevent that the underfill spills out of the groove during the lamination in the following step 7. Alternatively, a proper spreading pressure can be tuned to prevent the spilling out of the underfill 70. The underfill 70 can be a liquid transparent drier.

In the step 5, the substrate 1 and the package plate 3 are oppositely fitted but only fitting without applying laminating force to form the air outlet 20 at the position of the recess 51 of the frame 5 between the substrate 1 and the package plate 3.

In the step 6, the bubble among adhesives of the underfill 70 can be extracted by extracting air between the substrate 1 and the package plate 3 through the air outlet 20.

In the step 7, the substrate 1 and the package plate 3 are laminated. The width of the frame 5 in the groove 311 is larger than 2 mm after the lamination. The underfill 70 can fill in the area surrounded by the frame 5 after the substrate 1 and the package plate 3 are laminated because the bubble has been extracted among adhesives of the underfill 70 in the step 6. Accordingly, the package result is improved. The performance of the OLED elements can be raised and the lifetime of the OLED elements can be extended.

Ultimately, the step 8 is practiced. The UV light is employed to irradiate and solidify the seal glue 50 and the underfill 70. The packaging the substrate 1 with the package plate 3 is now accomplished.

Figure 5:
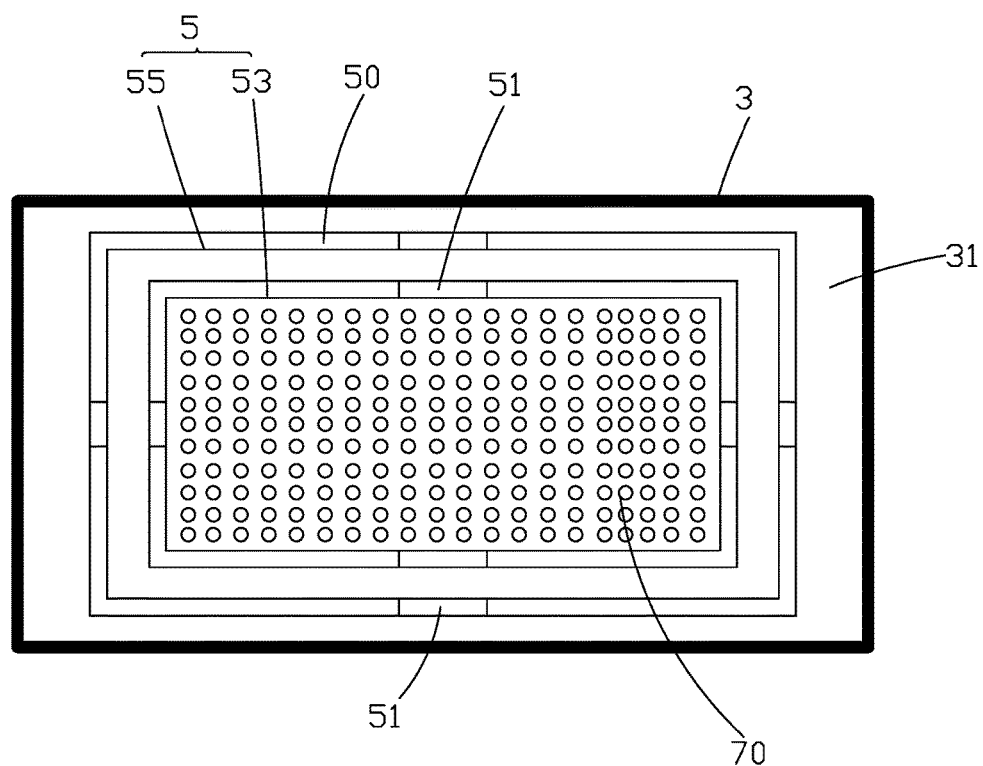
FIG. 5 is a top-view diagram of step 4 of the package method of a substrate according to the present invention and a top-view diagram of package plate before lamination of the package plate and the substrate according to the present invention.
Figure 6:
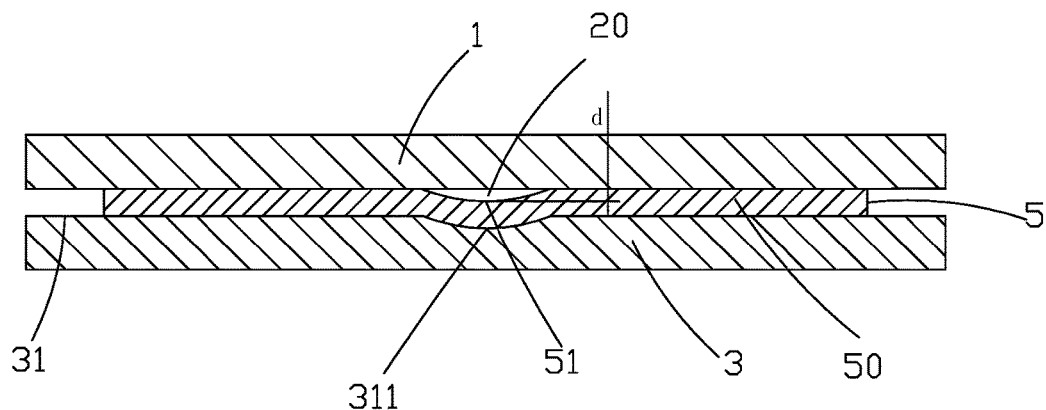
FIG. 6 is a main sectional diagram of step 5 of the package method of a substrate according to the present invention.
Figure 7:
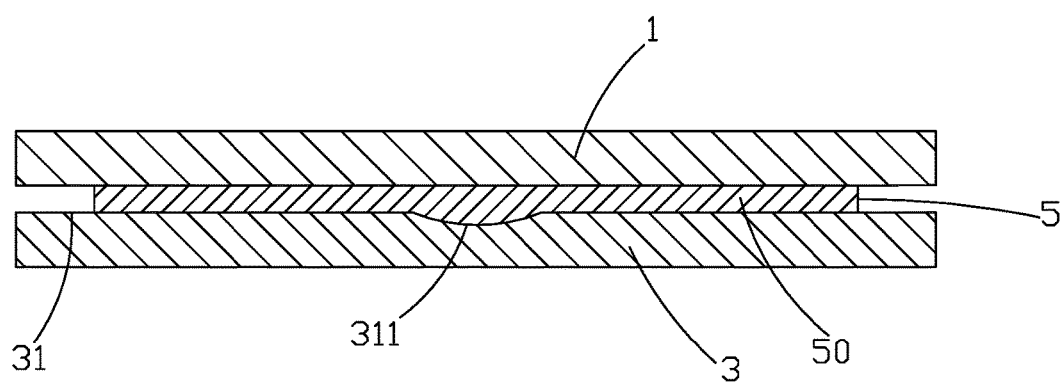
FIG. 7 is a main sectional diagram of step 8 of the package method of a substrate according to the present invention and a main sectional diagram of a package structure according to the present invention.

Please refer to FIG. 5 to FIG. 7. On the basis of the package method of the substrate provided by the present invention, the present invention further provides a package structure, comprising: a substrate 1, a package plate 3, a frame 5 formed by seal glue 50 between the substrate 1 and the package plate 3 and underfill 70, and the underfill 70 is positioned at an inner side of the frame 5, and the package plate 3 comprises a spreading surface 31, and at least one groove 311 is formed in a spreading path of a frame 5 on the spreading surface 31 of the package plate 3. The groove 311 can provide an outlet for extracting air to make no bubble among adhesives of the underfill 70 and filling in the frame 5 for guaranteeing a good package result. Accordingly, the performance of the OLED elements can be raised, and the lifetime of the OLED elements can be extended.

The substrate 1 is a TFT substrate having OLED elements; the frame 5 comprises an inner glue frame 53 and an outer glue frame 55, and at least one groove 311 is formed respectively in spreading paths corresponding to the inner and outer glue frames 53, 55 on the spreading surface 31 of the package plate 3, and the grooves 311 in the spreading path of the inner glue frame 53 and the grooves 311 in the spreading path of the outer glue frame 55 are aligned. As shown in FIG. 5, the recesses 51 corresponding to the grooves 311 are formed before the lamination of the package plate 3 and the substrate 1 but the recesses 51 vanish after the lamination of the package plate 3 and the substrate 1.

Preferably, the inner and outer glue frames 53, 55 are rectangular. An amount of the grooves 311 in the spreading path of the inner glue frame 53 and an amount of the grooves 311 in the spreading path of the outer glue frame 55 are respectively four and distributed at center positions of the four sides of the rectangles.

The seal glue 50 is UV glue. The underfill 70 can be a liquid transparent drier. The width of the frame 5 in the groove 311 is larger than 2 mm.

In conclusion, according to the package method of the substrate, by forming the grooves on the spreading surface of the package plate and forming recesses corresponding to the grooves as the frame is formed, the air outlet is formed after fitting the substrate and the package plate. Therefore, the air between the substrate and the package plate can be extracted. The issue of existing bubbles in underfill which is under filled as implementing Dam & Fill package can be solved. Accordingly, the present invention can improve the package result, raise the performance of the OLED elements, and extend the lifetime of the OLED elements. The method is simple and practicable. With the package structure of the present invention, by forming the grooves in the spreading path corresponding to the frame on the spreading surface of the package plate, it is capable of making no bubble among adhesives of the underfill and filling in the frame for guaranteeing a good package result. Accordingly, the performance of the OLED elements can be raised, and the lifetime of the OLED elements can be extended.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:
1. A package structure, comprising:
a substrate;
a package plate, which has a spreading surface that is set opposite to and spaced from the substrate; and a bonding frame of seal glue, which is arranged between the substrate and the surface of the package plate, wherein the bonding frame comprises an inner glue frame and an outer glue frame that are spaced from each other;

wherein the package plate comprises a first groove formed in a first spreading path corresponding to the inner glue frame and a second groove formed in a second spreading path corresponding to the outer glue frame, wherein the first groove in the first spreading path is substantially in alignment with the second groove in the second spreading path in a lateral or a longitudinal direction as seen in a plan view of the spreading surface.

2. The package structure according to claim 1 further comprising an underfill positioned inboard of the inner glue frame.

3. The package structure according to claim 2, wherein the underfill comprises a liquid transparent drier.

4. The package structure according to claim 1, wherein the substrate is a thin-film transistor (TFT) substrate having organic light emitting diode (OLED) elements.

5. The package structure according to claim 1, wherein the seal glue is UV glue.

6. The package structure according to claim 1, wherein a width of the inner glue frame in the first groove is larger than 2 mm.

7. The package structure according to claim 1, wherein a width of the outer glue frame in the second groove is larger than 2 mm.

8. A package structure, comprising:

a substrate;

a package plate, which has a spreading surface that is set opposite to and spaced from the substrate; and a bonding frame of seal glue, which is arranged between the substrate and the surface of the package plate, wherein the bonding frame comprises an inner glue frame and an outer glue frame that are spaced from each other;

wherein the package plate comprises a first groove formed in a first spreading path corresponding to the inner glue frame and a second groove formed in a second spreading path corresponding to the outer glue frame, wherein the first groove in the first spreading path is substantially in alignment with the second groove in the second spreading path in a lateral or a longitudinal direction as seen in a plan view of the spreading surface, a width of each of the inner glue frame and the outer glue frame respectively in the first groove and the second groove being larger than 2 mm.

9. The package structure according to claim 8 further comprising an underfill positioned inboard of the inner glue frame.

10. The package structure according to claim 8, wherein the substrate is a thin-film transistor (TFT) substrate having organic light emitting diode (OLED) elements.

11. The package structure according to claim 8, wherein the seal glue is UV glue.

12. The package structure according to claim 9, wherein the underfill comprises a liquid transparent drier.

* * * * *